(12) United States Patent
Mao

(10) Patent No.: US 10,420,234 B1
(45) Date of Patent: Sep. 17, 2019

(54) DETACHABLE ASSEMBLY DEVICE

(71) Applicant: Wistron Corp., New Taipei (TW)

(72) Inventor: Zhong-Hui Mao, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 16/212,795

(22) Filed: Dec. 7, 2018

(30) Foreign Application Priority Data

Jun. 28, 2018 (CN) .......................... 2018 1 0685421

(51) Int. Cl.
*G06F 1/18* (2006.01)
*H05K 5/02* (2006.01)
*H05K 7/14* (2006.01)
*H05K 7/16* (2006.01)
*H05K 5/03* (2006.01)
*H01R 12/72* (2011.01)
*H01R 12/73* (2011.01)

(52) U.S. Cl.
CPC ............. *H05K 5/023* (2013.01); *G06F 1/186* (2013.01); *H05K 5/0221* (2013.01); *H05K 5/0247* (2013.01); *H05K 5/03* (2013.01); *H05K 7/1427* (2013.01); *H05K 7/16* (2013.01); *H01R 12/721* (2013.01); *H01R 12/724* (2013.01); *H01R 12/737* (2013.01)

(58) Field of Classification Search
CPC ....................................................... G06F 1/186
See application file for complete search history.

(56) References Cited

U.S. PATENT DOCUMENTS

| | | | | |
|---|---|---|---|---|
| 5,734,551 A * | 3/1998 | Hileman | ................ | G06F 1/184 361/695 |
| 5,906,497 A * | 5/1999 | Pham | ..................... | G06F 1/184 361/679.46 |
| 6,010,345 A * | 1/2000 | Allen | ..................... | G06F 1/184 439/159 |
| 6,111,754 A * | 8/2000 | Abbott | ................... | G06F 1/184 312/223.2 |
| 6,185,104 B1 * | 2/2001 | Obermaier | ............. | G06F 1/184 361/756 |
| 9,510,477 B1 * | 11/2016 | Zou | ..................... | H05K 7/1489 |
| 9,826,658 B1 * | 11/2017 | Mao | ..................... | H05K 7/1487 |
| 10,251,300 B1 * | 4/2019 | Mao | ..................... | H05K 7/1489 |

(Continued)

*Primary Examiner* — Adrian S Wilson
(74) *Attorney, Agent, or Firm* — Locke Lord LLP; Tim Tingkang Xia, Esq.

(57) ABSTRACT

The present invention provides a detachable assembly device. The detachable assembly device is configured to electrically connect electronic device with main circuit board. The detachable assembly device comprises carrier, support frame, handle and linkage assembly. The carrier is configured to fix main circuit board. The support frame is configured to fix electronic device. The support frame is movably disposed on side of carrier and comprises a cover plate and a second side plate that are connected to each other. A portion of handle is pivotally connected to portion of cover plate. Two portions of linkage assembly are respectively pivotally connected to another portion of handle and to another portion of cover plate. When support frame is located in a locked position that is relatively close to carrier, handle and first side plate are engaged with each other, and electronic device is electrically connected with main circuit board.

17 Claims, 22 Drawing Sheets

(56) References Cited

U.S. PATENT DOCUMENTS

| | | | |
|---|---|---|---|
| 2007/0081316 A1* | 4/2007 | Peng | G06F 1/185 |
| | | | 361/801 |
| 2012/0127658 A1* | 5/2012 | Hartman | G06F 1/186 |
| | | | 361/679.59 |
| 2013/0021743 A1* | 1/2013 | Hu | G06F 1/186 |
| | | | 361/679.32 |
| 2016/0073554 A1* | 3/2016 | Marcade | H05K 5/023 |
| | | | 211/26 |
| 2019/0138065 A1* | 5/2019 | Chen | G06F 1/185 |

* cited by examiner

DETACHABLE ASSEMBLY DEVICE

CROSS-REFERENCE TO RELATED APPLICATIONS

This non-provisional application claims priority under 35 U.S.C. § 119(a) on Patent Application No(s). 201810685421.0 filed in China, on Jun. 28, 2018, the entire contents of which are hereby incorporated by reference.

TECHNICAL FIELD

The disclosure relates to a detachable assembly device, more particularly to a detachable assembly device of a graphics processing module.

BACKGROUND

When a graphics card is detached from or installed to a casing, a user needs to use both hands to press or pull three different places on the graphics card. However, it is difficult to guarantee the balance of the force applied on each place. During the installation or removal of the graphics card, if the forces applied by the user are unbalanced, it is difficult to keep the graphics card in a horizontal manner, leading to the difficulty in installation or removal of the graphics card. More seriously, it may cause connectors of the graphics card and the main circuit board to connect in an undesired manner and result in the damage thereof.

Accordingly, an improved detachable assembly device to solve the above issues is desirable.

SUMMARY OF THE INVENTION

One embodiment of the disclosure provides a detachable assembly device. The detachable assembly device is configured to electrically connect an electronic device with a main circuit board. The detachable assembly device comprises a carrier, a support frame, a handle and a linkage assembly. The carrier is configured to fix the main circuit board, and the carrier comprises a base plate and a first side plate that are connected to each other. The support frame is configured to fix the electronic device. The support frame is movably disposed on a side of the carrier and comprises a cover plate and a second side plate that are connected to each other. The cover plate covers the base plate. The first side plate and the second side plate are located between the base plate and the cover plate, and the second side plate is movably connected to the first side plate. A portion of the handle is pivotally connected to a portion of the cover plate. Two portions of the linkage assembly are respectively pivotally connected to another portion of the handle and to another portion of the cover plate. Wherein when the support frame is located in a locked position, the handle and the first side plate are engaged with each other, and the electronic device is electrically connected with the main circuit board.

BRIEF DESCRIPTION OF THE DRAWINGS

The present disclosure will become better understood from the detailed description given herein below and the accompanying drawings which are given by way of illustration only and thus are not intended to limit the present disclosure and wherein.

DETAILED DESCRIPTION

Figure 1:
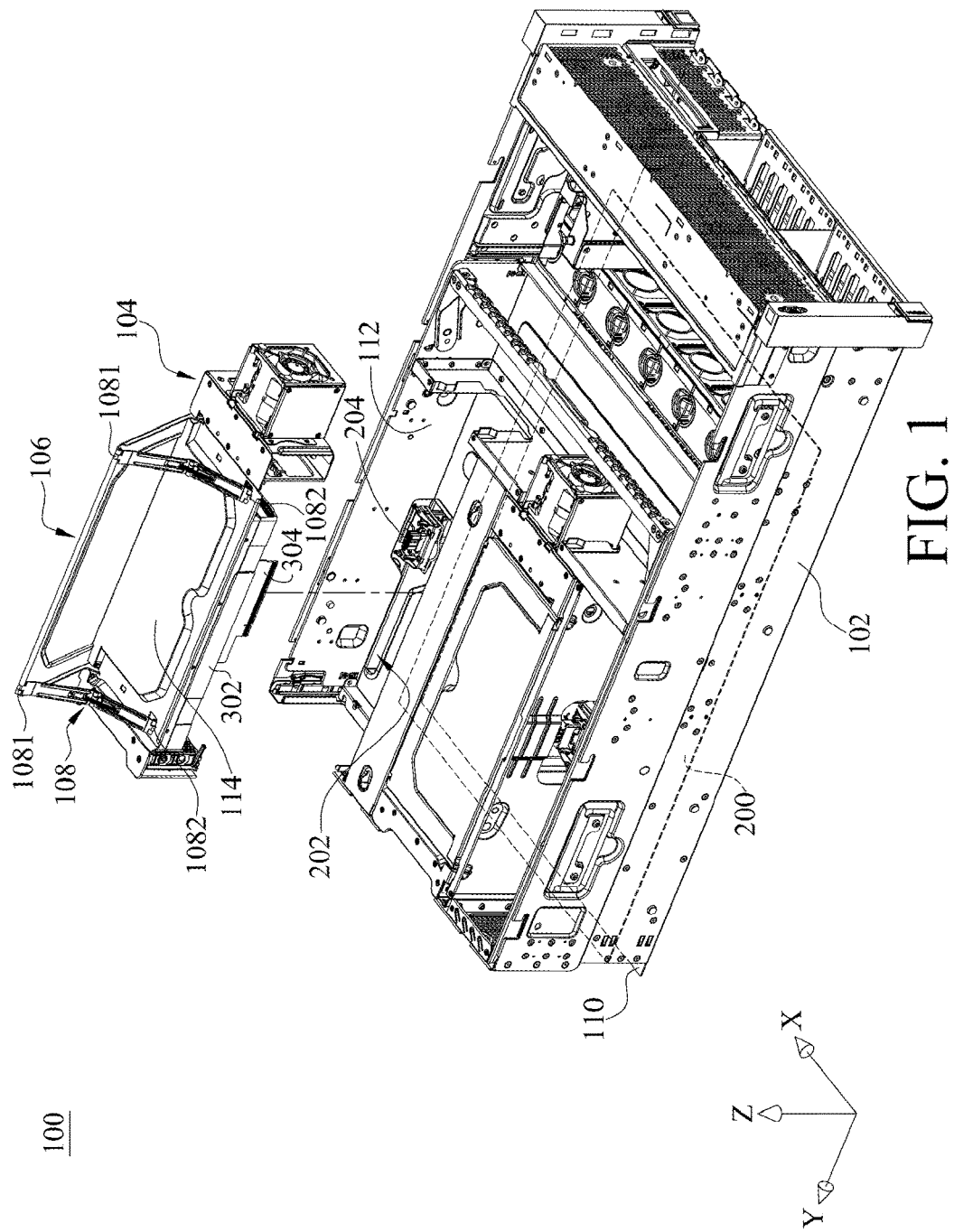
FIG. 1 is an exploded perspective view of a detachable assembly device according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
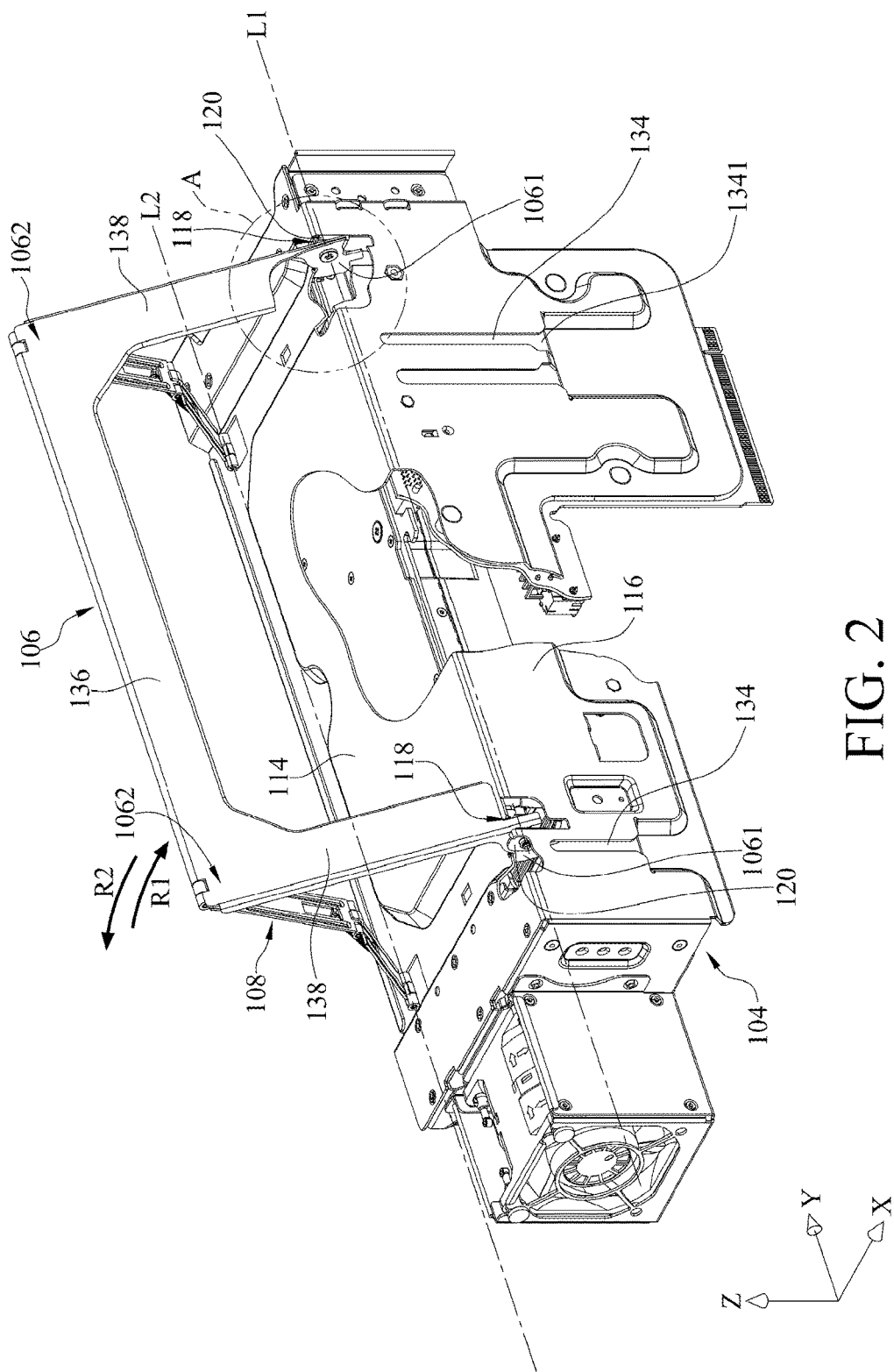
FIG. 2 is a partial perspective assembly view of the detachable assembly device.
Figure 12:
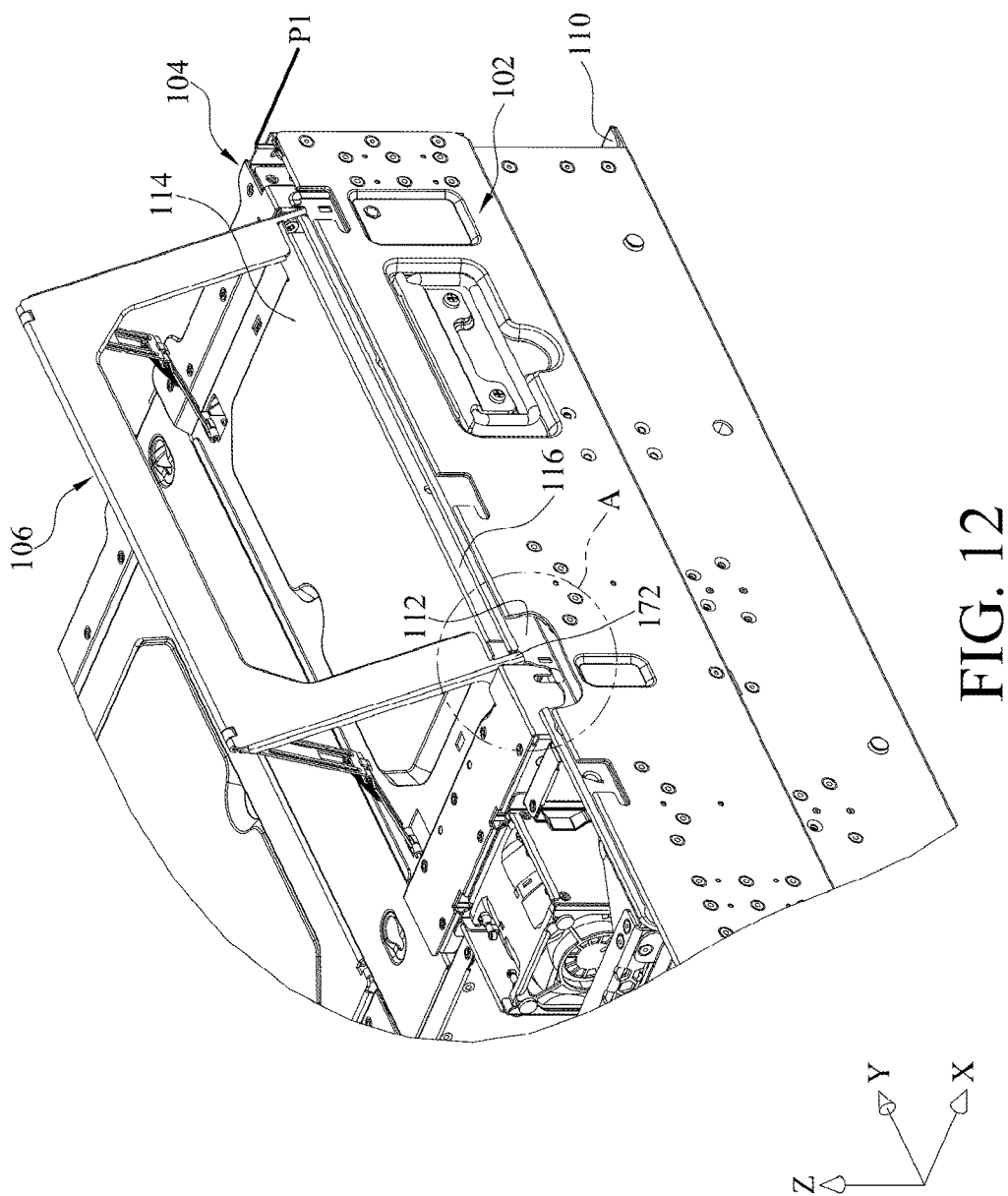
Figure 14:
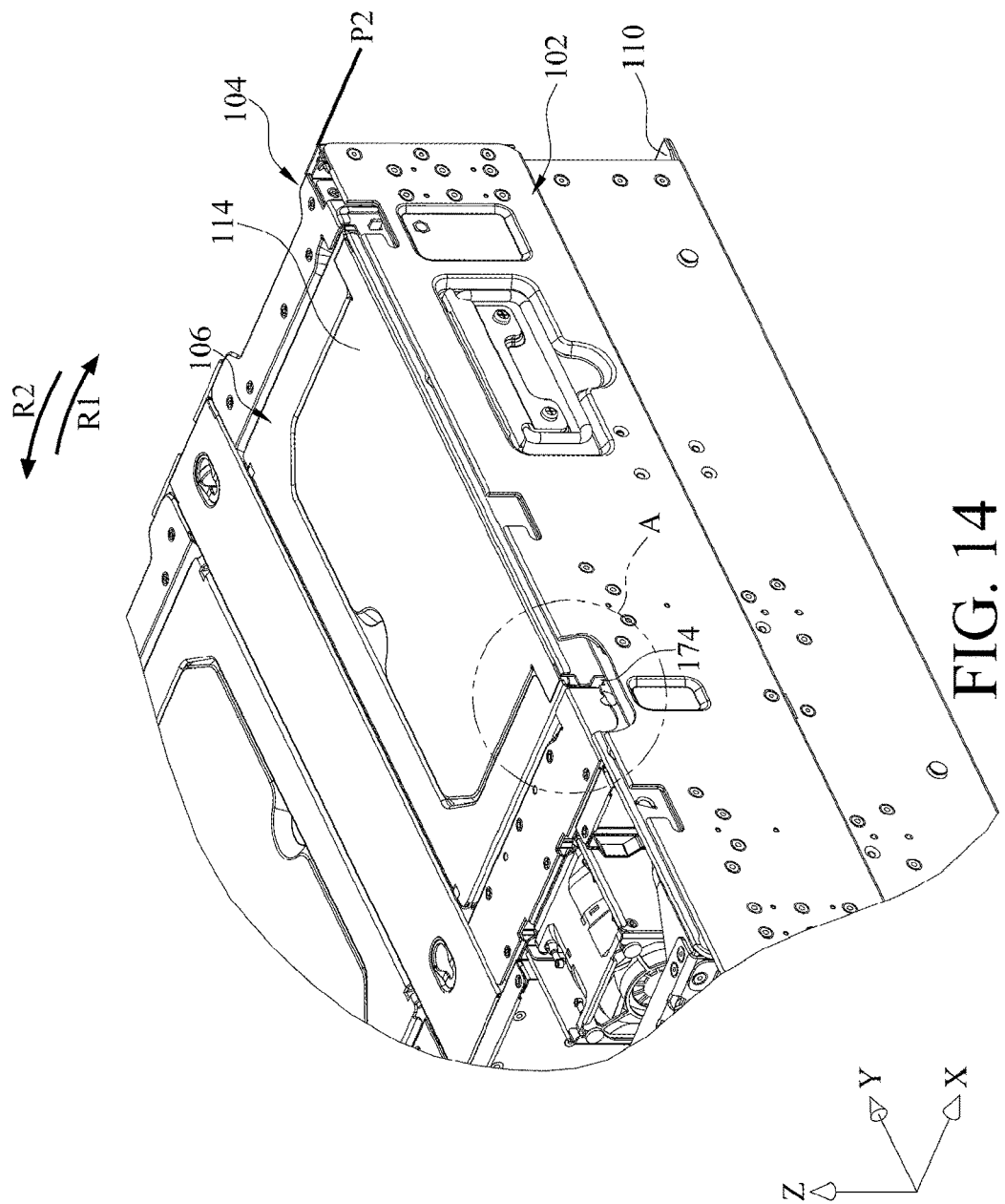

Please refer to FIG. 1 and FIG. 2. FIG. 1 is an exploded perspective view of a detachable assembly device according to a first embodiment of the present disclosure. FIG. 2 is a partial perspective assembly view of the detachable assembly device. This embodiment provides a detachable assembly device 100. The detachable assembly device 100 includes a carrier 102, a support frame 104, a handle 106 and a linkage assembly 108. The carrier 102 includes a base plate 110 and a first side plate 112. There may be a main circuit board 200 fixed on the base plate 110. As shown in the figures, an extension direction of the base plate 110 is, for example, parallel to the XY plane, and the first side plate 112 is, for example, vertically connected to a side of the base plate 110. The support frame 104 is movably disposed on a side of the carrier 102 so as to be movable between an abutting position P1 (as shown in FIG. 12) that is located relatively away from the carrier 102 and a locked position P2 (as shown in FIG. 14) that is located relatively close to the carrier 102. The support frame 104 includes a cover plate 114 and a second side plate 116. As shown in the figures, an extension direction of the cover plate 114 is, for example, parallel to the XY plane, and the second side plate 116 is, for example, vertically connected to a side of the cover plate 114. The cover plate 114 covers part of the base plate 110. An extension direction of the first side plate 112 and an extension direction of the second side plate 116 are, for example, parallel to the YZ plane, and the first side plate 112 and the second side plate 116 are located between the base plate 110 and the cover plate 114. The support frame 104 has two holes 118 (shown in FIG. 9) on the intersection of a plane in which the cover plate 114 is located and a plane in which the second side plate 116 is located. The second side plate 116 includes two tabs 120 (shown in FIG. 5) respectively located at the two holes 118. The handle 106 has two mounting portions 1061. The two mounting portions 1061 are respectively pivotally coupled to the two tabs 120 about a first pivot axis L1 so that the two mounting portions 1061 are respectively pivotable in the two holes 118 (shown in FIG. 9). The handle 106 further has two connecting portions 1062, and the linkage assembly 108 has two first connecting parts 1081 and two second connecting parts 1082. The two connecting portions 1062 are respectively pivotally coupled to the two first connecting parts 1081, and the two second connecting parts 1082 are pivotally coupled to the cover plate 114 about a second pivot axis L2. As shown in the figures, the first pivot axis L1 and the second pivot axis L2 are not coaxial.

Figure 3:
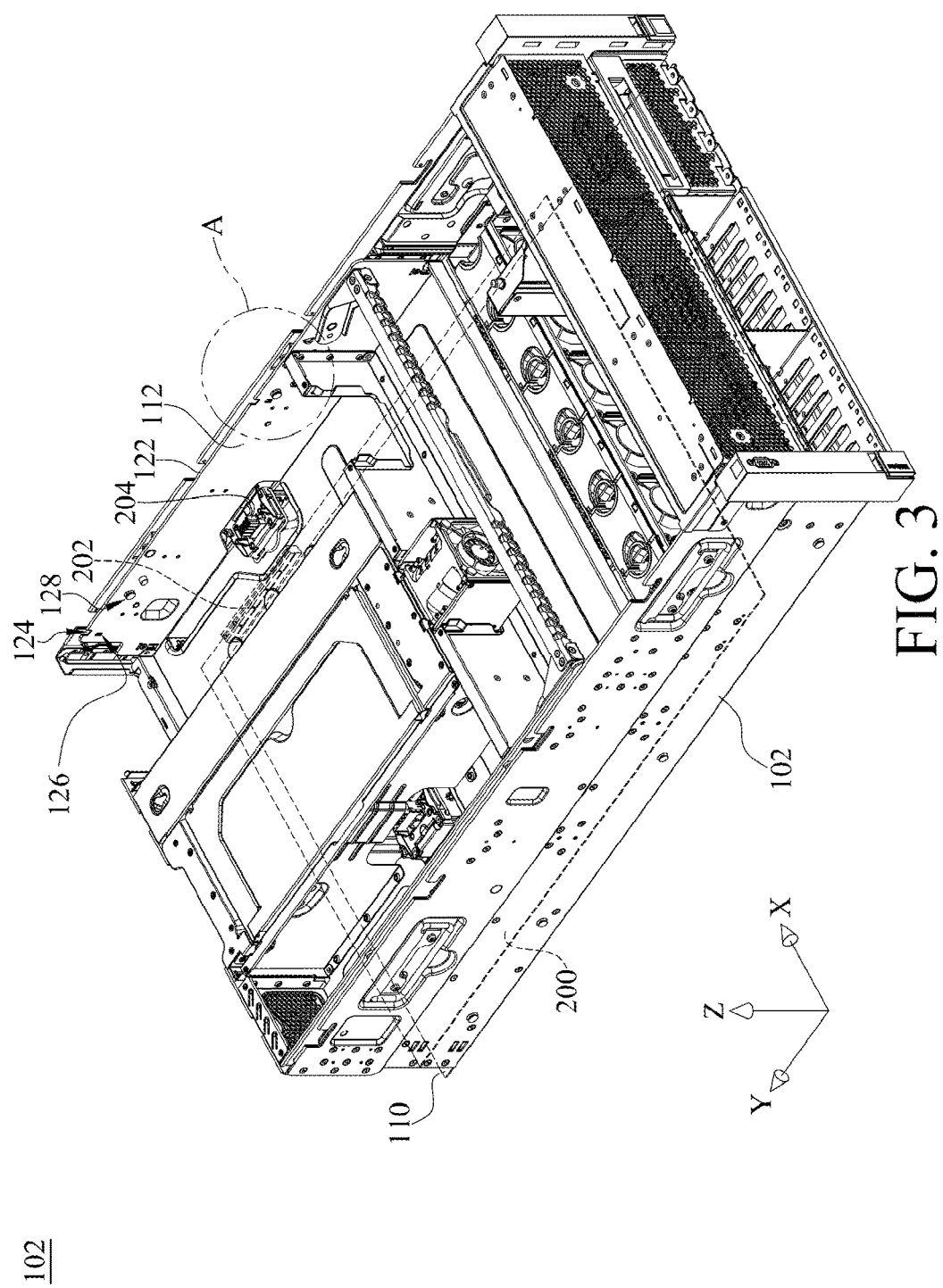
FIG. 3 is a perspective view of a carrier of the detachable assembly device.
Figure 4:
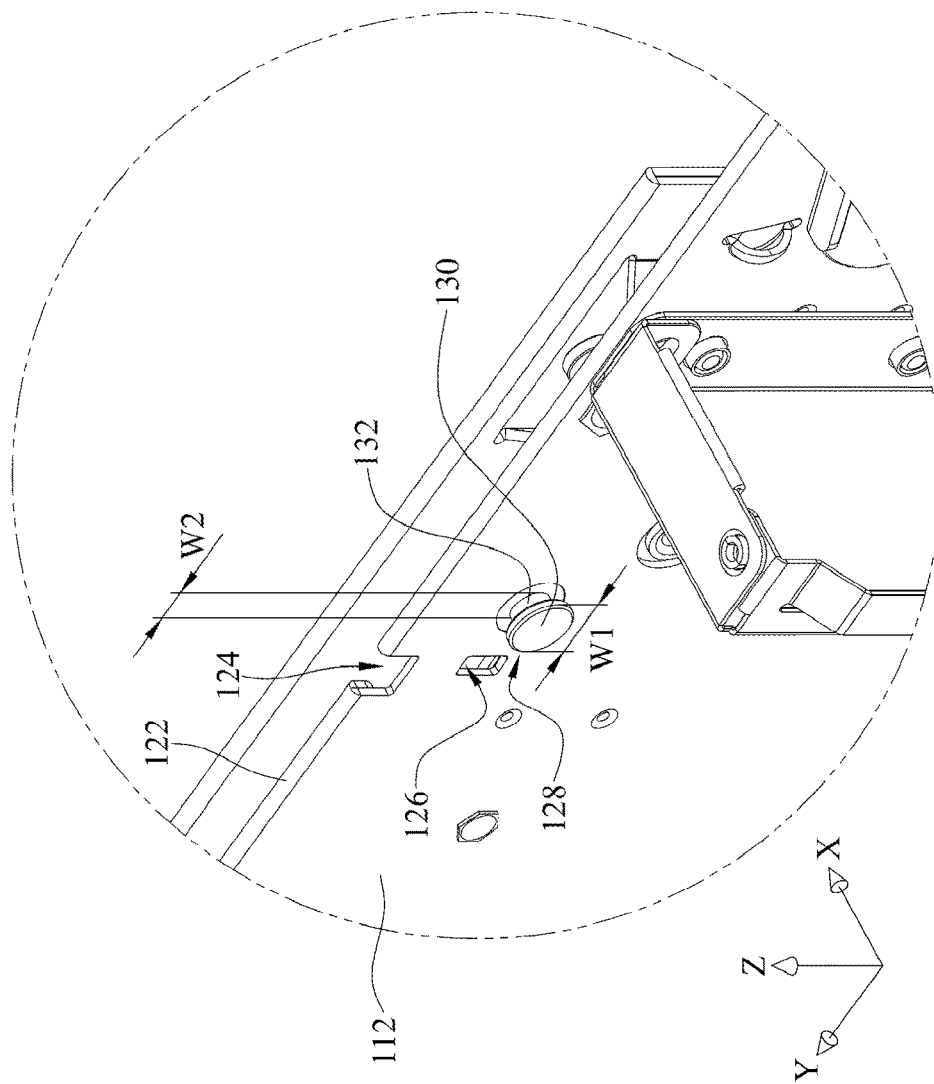
FIG. 4 is a partially enlarged view of the FIG. 3.

Please refer to FIG. 3 and FIG. 4. FIG. 3 is a perspective view of a carrier of the detachable assembly device, and FIG. 4 is a partially enlarged view of the FIG. 3. As shown in FIG. 3 and FIG. 4, the main circuit board 200 includes a first connector 202 and a second connector 204. The first connector 202 (shown in dotted line in FIG. 3 or referring to FIG. 21) is closer to the base plate 110 than the second connector 204. The first side plate 112 has an upper end 122 and two indentations 124 which are formed on the upper end 122 and separated from each other. The first side plate 112 includes two engage holes 126 separated from each other and respectively located below the two indentations 124. The first side plate 112 further includes two guiding pieces 128 separated from each other. The two guiding pieces 128 are, for example, positioning steel posts and are spaced by the same distance from the upper end 122. Each guiding piece 128 includes a head part 130 and a neck part 132 that are connected to each other. The head part 130 has a width of W1 along the Y-axis, the neck part 132 has a width of W2 along the Y-axis, and W1 is larger than W2; that is, the head part 130 is wider than the neck part 132.

As shown in FIG. 2, the second side plate 116 includes two guiding portions 134 extending toward the base plate 110, and the two guiding portions 134 respectively correspond to the two guiding pieces 128, thus the guiding portions 134 are respectively aligned with the guiding pieces 128. In other embodiments, the locations of the guiding piece 128 and the guiding portions 134 may be exchanged. Furthermore, the quantities of the guiding pieces 128 and the guiding portions 134 are not restricted and may be changed according to actual requirement.

Figure 5:
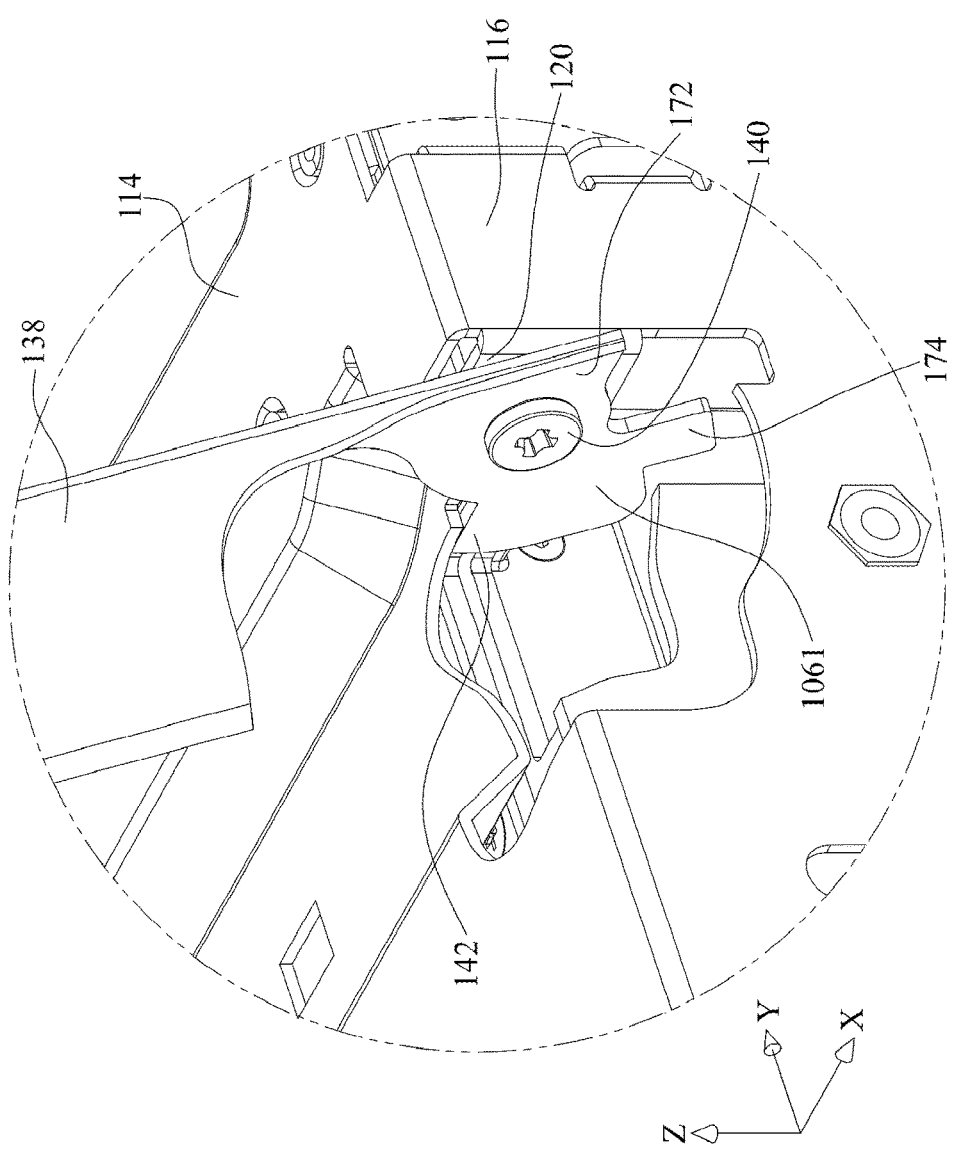
FIG. 5 is a partially enlarged view of the FIG. 2.

FIG. 5 is a partially enlarged view of the FIG. 2. As show in FIG. 2 and FIG. 5, the handle 106 includes a middle part 136 and two side parts 138. The two side parts 138 are respectively connected to two opposite ends of the middle part 136. Each side part 138 includes the mounting portion 1061, and each mounting portion 1061 is pivotally connected to the tab 120 via a first pivot 140. Each mounting portion 1061 includes a protrusion 142. When the handle 106 is pivoted by a predetermined angle along a first direction R1 that is away from the support frame 104, the protrusions 142 are stopped by the cover plate 114 so as to stop the handle 106 from pivoting along the first direction R1.

Figure 6:
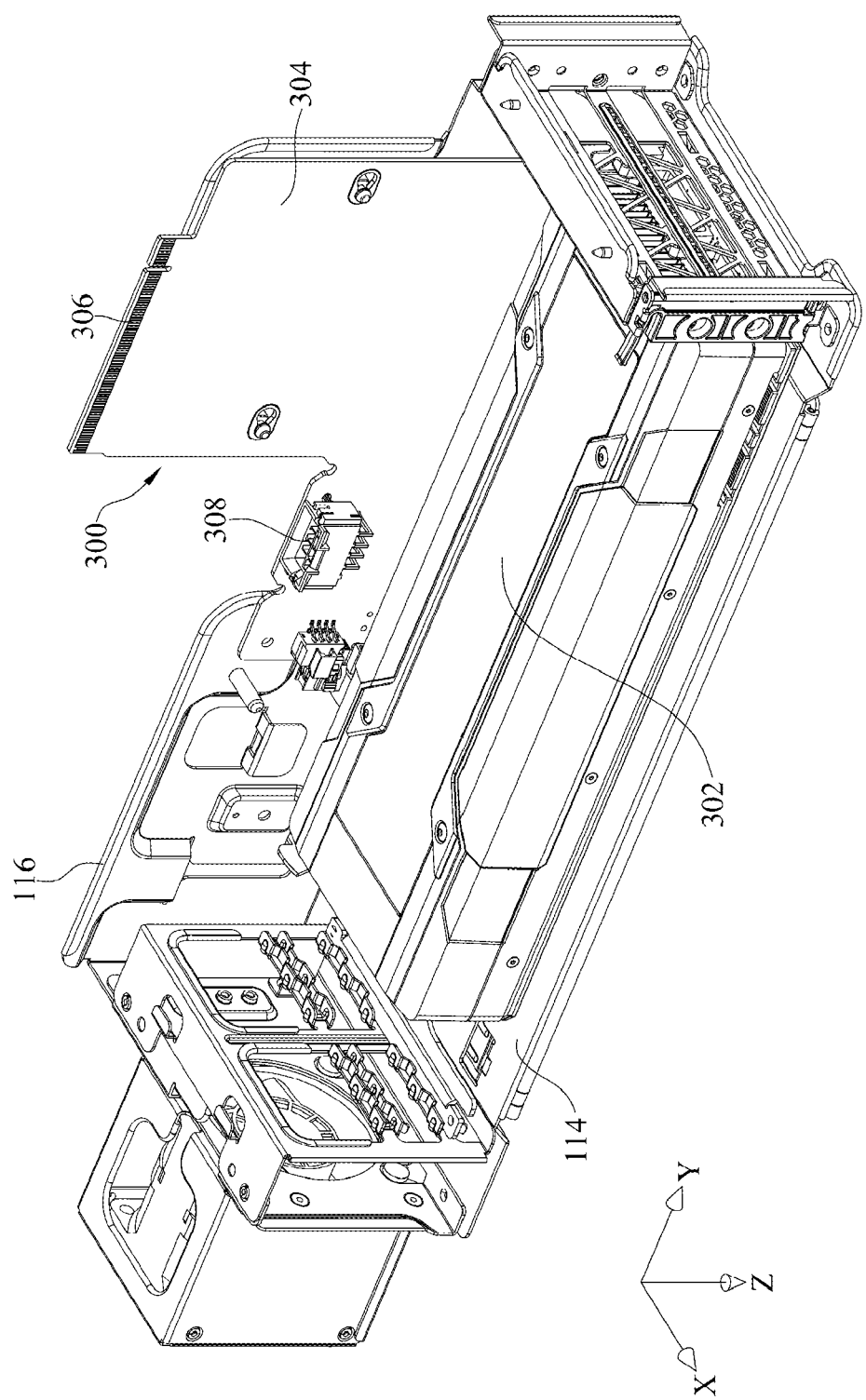
FIG. 6 is a perspective view showing that a graphics processing module is fixed to a support frame of the detachable assembly device.

FIG. 6 is a perspective view showing that a graphics processing module is fixed to a support frame of the detachable assembly device. As shown in FIG. 3 and FIG. 6, the graphics processing module 300 includes a computing card 302 and an expansion card 304 that are assembled to each other. The computing card 302 is fixed to the cover plate 114. The expansion card 304 is, for example, vertically mounted to a side of the computing card 302 and is electrically connected to the computing card 302. The expansion card 304 and the second side plate 116 are separated from each other along the X-axis. The expansion card 304 includes a third connector 306 and a fourth connector 308. The third connector 306 and the fourth connector 308 of the expansion card 304 respectively correspond to the first connector 202 and the second connector 204 of the main circuit board 200.

Figure 7:
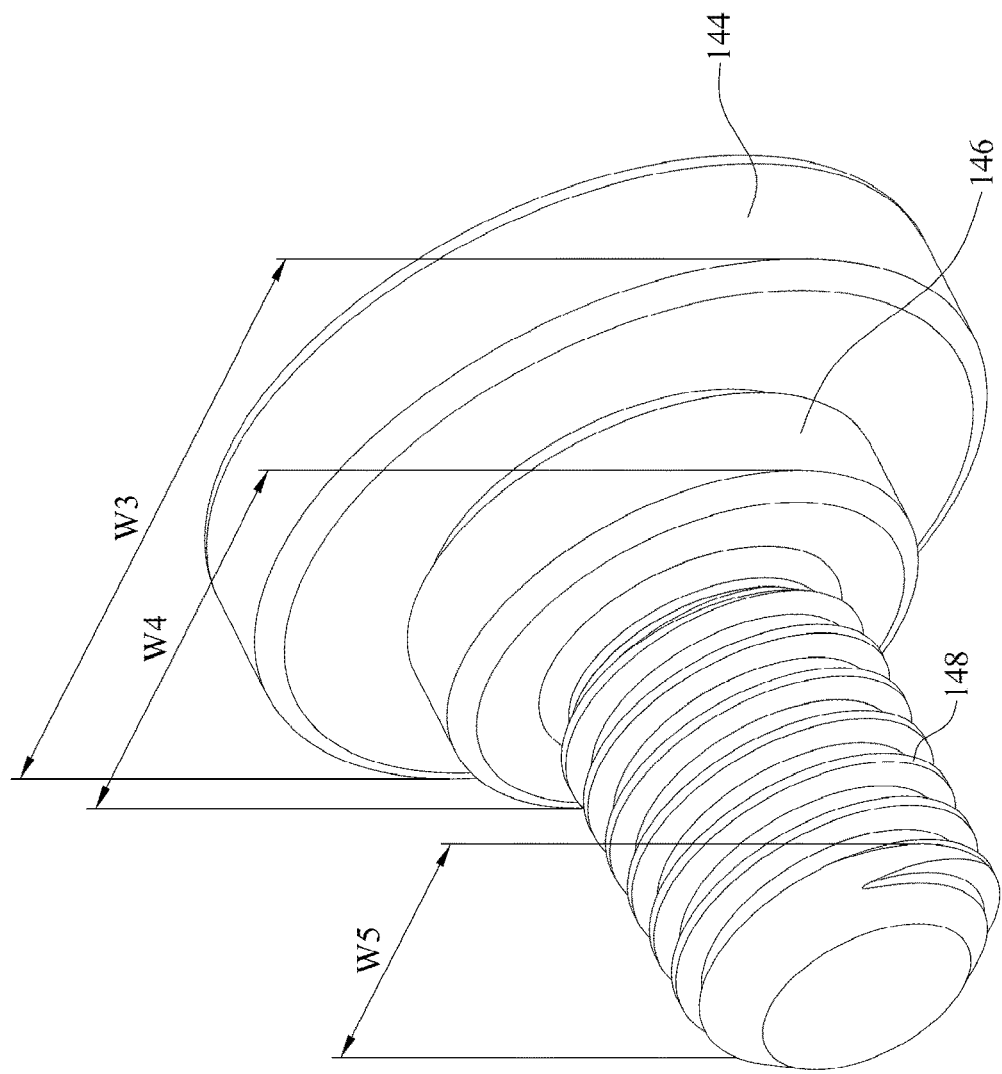
FIG. 7 is a perspective view of a first pivot of the detachable assembly device.

FIG. 7 is a perspective view of a first pivot of the detachable assembly device. As shown in FIG. 5 and FIG. 7, the mounting portion 1061 of the handle 106 is pivotally connected to the tab 120 via the first pivot 140. The first pivot 140 includes a head part 144, a neck part 146 and an engaging part 148. The neck part 146 is located between and connected to the head part 144 and the engaging part 148. The head part 144 has a width of W3, the neck part 146 has a width of W4, and the engaging part 148 has a width of W5, wherein W3 is larger than W4, and W4 is larger than W5. That is, the head part 144 is wider than the neck part 146, and the neck part 146 is wider than the engaging part 148. In addition, the diameter of the pivotal holes (not shown) on the mounting portions 1061 are larger than W4 and smaller than W3. Thus, the mounting portions 1061 can be pivotally disposed on the neck part 146, and the head part 144 is able to prevent the handle 106 from moving along the Y-axis.

Figure 8:
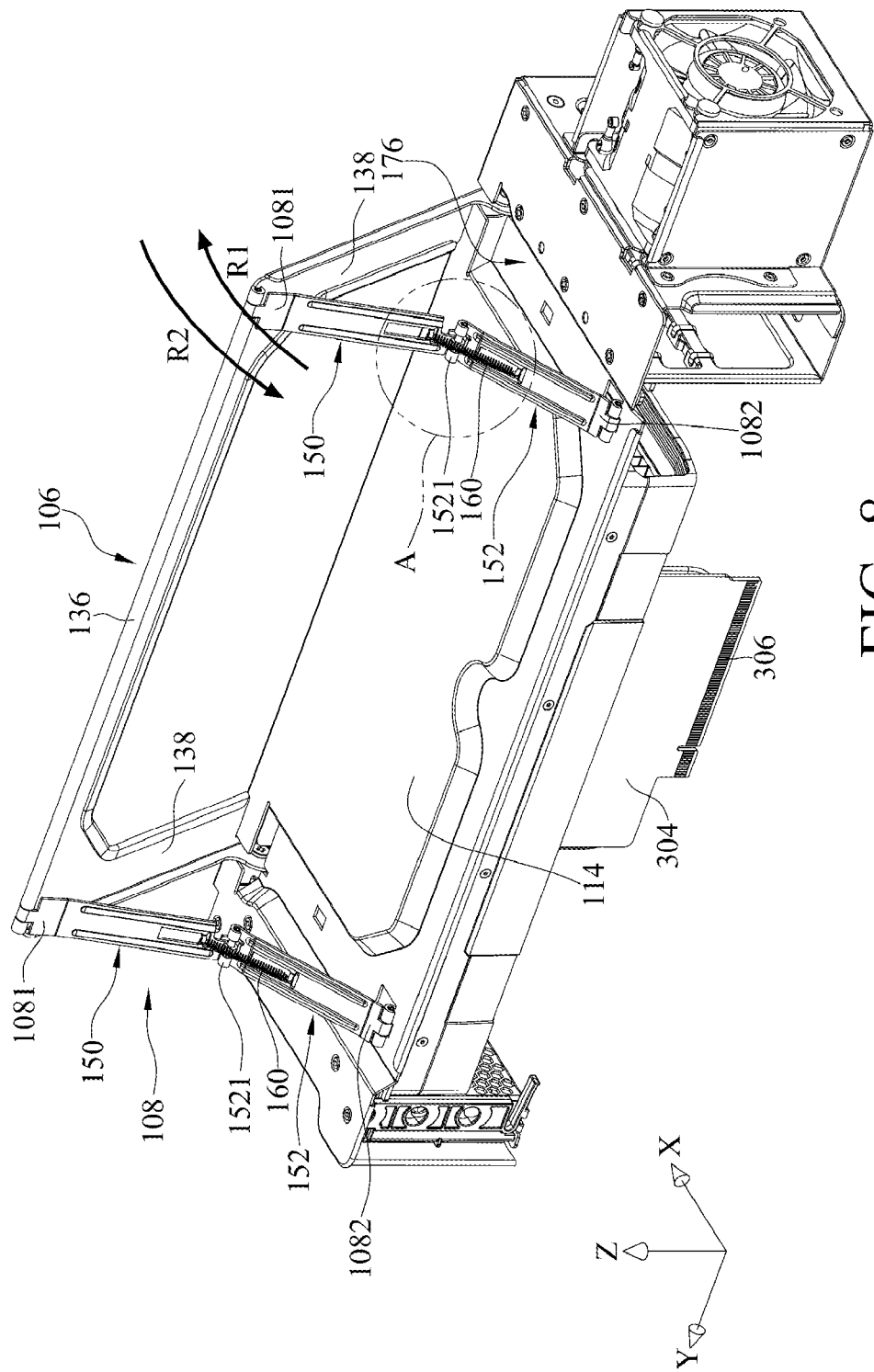
FIG. 8 is a partial perspective assembly view of the detachable assembly device from another angle of view.
Figure 9:
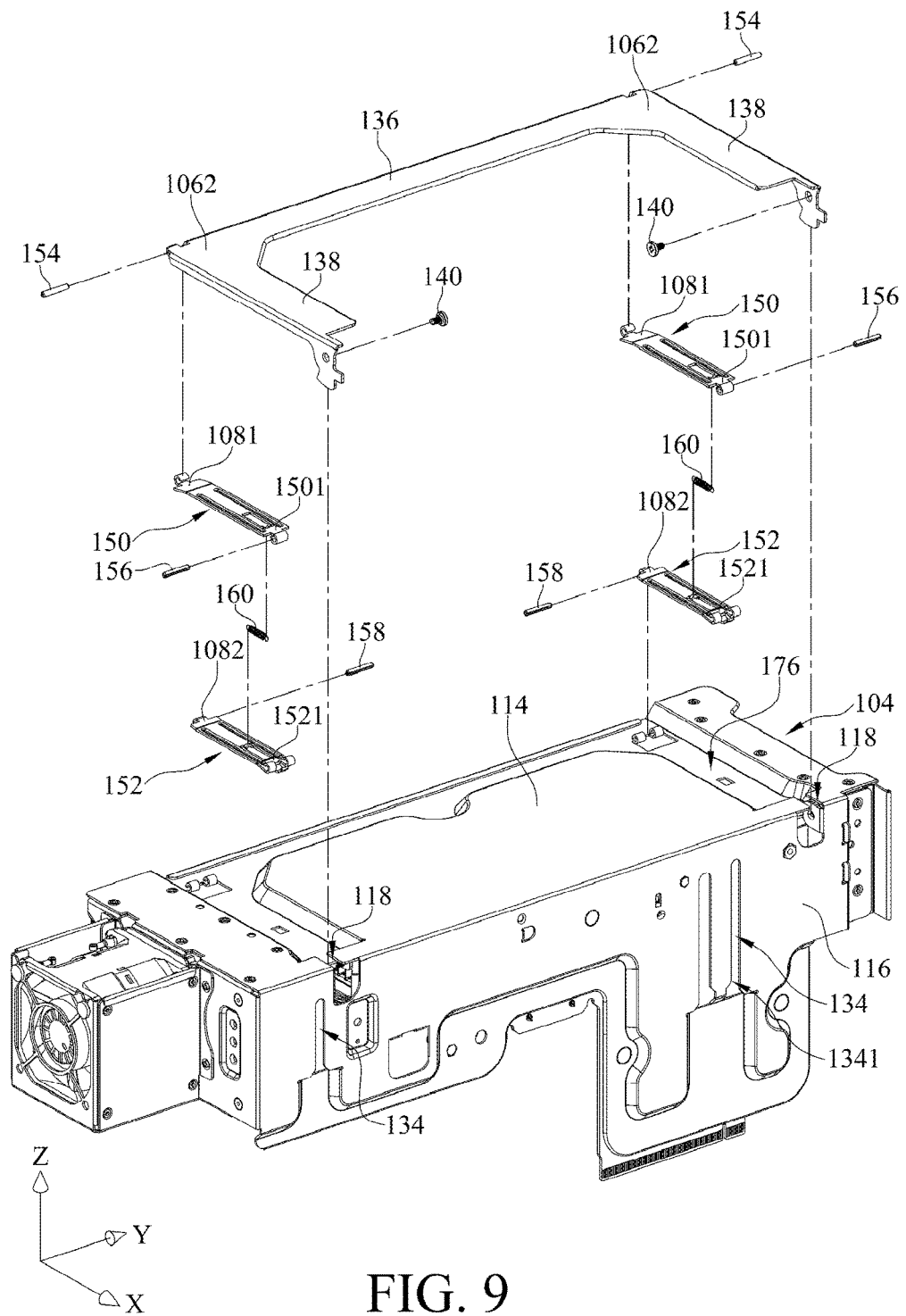
FIG. 9 is an exploded perspective view of the support frame, a handle and a linkage assembly of the detachable assembly device.
Figure 10:
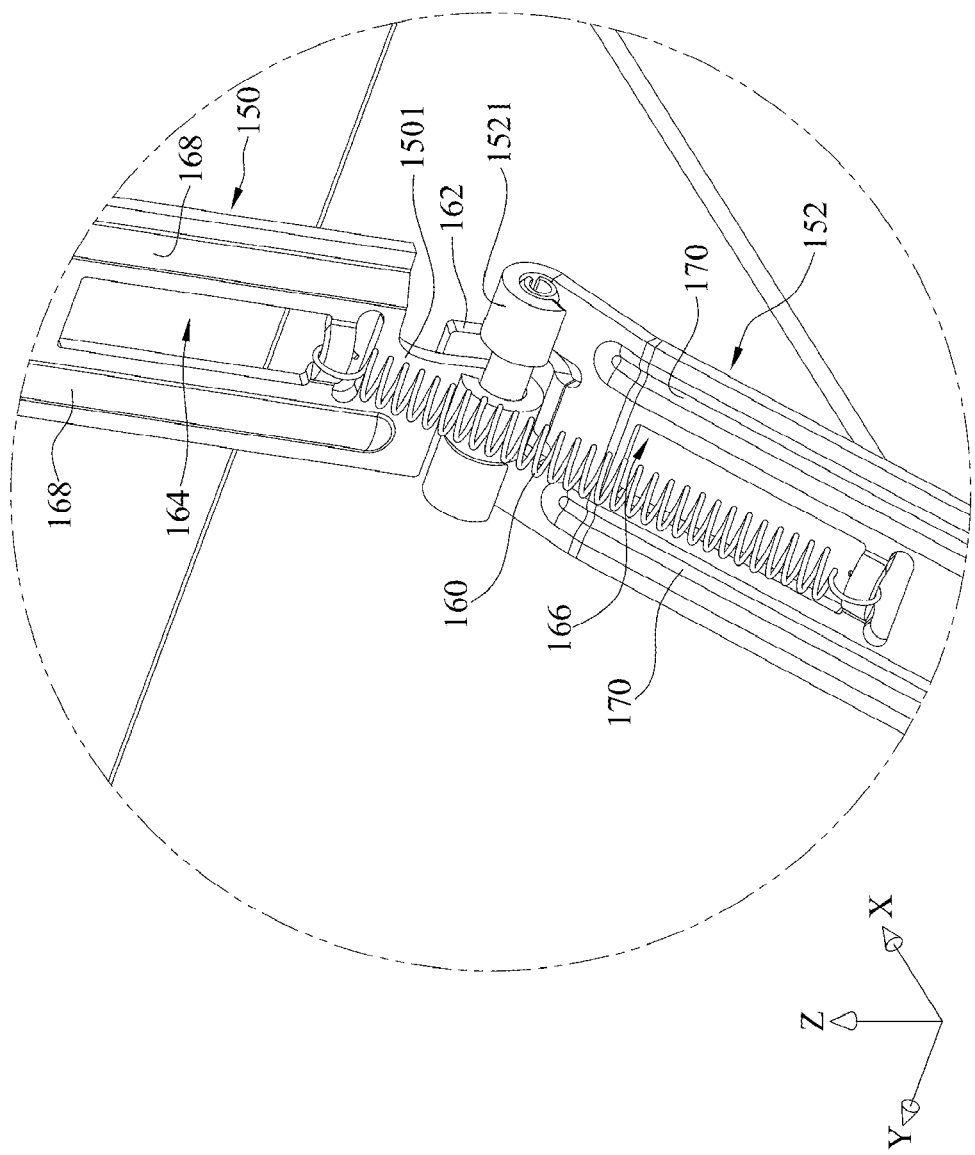
FIG. 10 is a partially enlarged view of FIG. 8.

FIG. 8 is a partial perspective assembly view of the support frame, the handle and the linkage assembly of the detachable assembly device from another angle of view. FIG. 9 is an exploded perspective view of the support frame, the handle and the linkage assembly of the detachable assembly device. FIG. 10 is a partially enlarged view of FIG. 8. As shown in FIG. 8 and FIG. 9, the linkage assembly 108 includes two first linkage components 150 and two second linkage components 152. Each first linkage component 150 includes the first connecting part 1081 and a third connecting part 1501. Each second linkage component 152 includes the second connecting parts 1082 and a fourth connecting part 1521. The first connecting parts 1081 are respectively pivotally coupled to the connecting portions 1062 via two second pivots 154. The third connecting parts 1501 are respectively pivotally coupled to the fourth connecting parts 1521 via two third pivots 156. The second connecting parts 1082 are pivotally coupled to the cover plate 114 respectively via two fourth pivots 158. In this embodiment, the second pivots 154, the third pivots 156 and the fourth pivots 158 are all spring pins. According to one embodiment of the disclosure, the second pivots 154, the third pivots 156 and the fourth pivots 158 may be replaced with other types of pivot pins.

As shown in FIG. 8 and FIG. 9, in the one first linkage component 150 and the one second linkage component 152 that are connected, when the handle 106 is pivoted along the first direction R1, the handle 106 unfolds the linkage assembly 108 so that the first linkage components 150 are pivoted along the first direction R1, and the second linkage components 152 are pivoted along a second direction R2 (the second direction R2 is opposite to the first direction R1). As a result, the first linkage components 150 and the second linkage components 152 are spread. On the contrary, when the handle 106 is pivoted along the second direction R2, the handle 106 folds the linkage assembly 108 so that the first linkage components 150 are pivoted along the second direction R2, and the second linkage components 152 are pivoted along the first direction R1. As a result, the first linkage components 150 are respectively stacked on the second linkage components 152.

As shown in FIG. 8 and FIG. 10, the linkage assembly 108 further includes two springs 160, and two ends of each spring 160 are respectively fixed to the first linkage components 150 and the second linkage components 152. When the handle 106 is pivoted along the first direction R1, each first linkage component 150 is pivoted along the first direction R1, and each second linkage component 152 is pivoted along the second direction R2. And during the movement of the handle 106, each spring 160 is pulled by the first linkage component 150 and the second linkage component 152 so as to store energy. When the handle 106 is released, the energy will be utilized to drive the first linkage component 150 to pivot along the second direction R2 and to drive the second linkage component 152 to pivot along the first direction R1. And the pivoting movement of the first linkage component 150 drives the handle 106 to pivot along the second direction R2 as well.

In addition, as shown in FIG. 10, the two fourth connecting parts 1521 of the two second linkage components 152 each further includes a stopper 162 which is located close to the third connecting part 1501 of the first linkage component 150. The maximum angle between the first linkage component 150 and the second linkage component 152 is smaller than 180 degrees. When the handle 106 is pivoted along the first direction R1 by a predetermined angle to cause the angle between the first linkage component 150 and the second linkage component 152 to reach the maximum angle, the stopper 162 presses against the third connecting part 1501 of the first linkage component 150 and stops the movement of the first linkage component 150 so as to stop the handle 106 from pivoting along the first direction R1.

Furthermore, as shown in FIG. 10, the first linkage component 150 includes a first spring accommodating slot 164, and the second linkage component 152 includes a second spring accommodating slot 166. The first linkage component 150 further includes two first reinforcement ribs 168 respectively located on two opposite sides of the first spring accommodating slot 164. The second linkage component 152 further includes two second reinforcement ribs 170 respectively located on two opposite sides of the second spring accommodating slot 166.

As shown in FIG. 8, when the angle between the first linkage components 150 and the second linkage components 152 does not yet reach the maximum angle, the handle 106, the linkage assembly 108 and the cover plate 114 constitute a four-bar linkage. When the handle 106 is lifted up so as to suspend the support frame 104 in the air, the weights of the graphics processing module 300 and the support frame 104 cause the protrusion 142 of the handle 106 to press against the cover plate 114 and cause the angle between the first linkage components 150 and the second linkage components 152 to increase to the maximum angle. At this moment, the handle 106, the linkage assembly 108 and the cover plate 114 constitute a three-bar linkage, and the middle part 136 of the handle 106 locates above the center of gravity of the graphics processing module 300 and the support frame 104.

Figure 11:
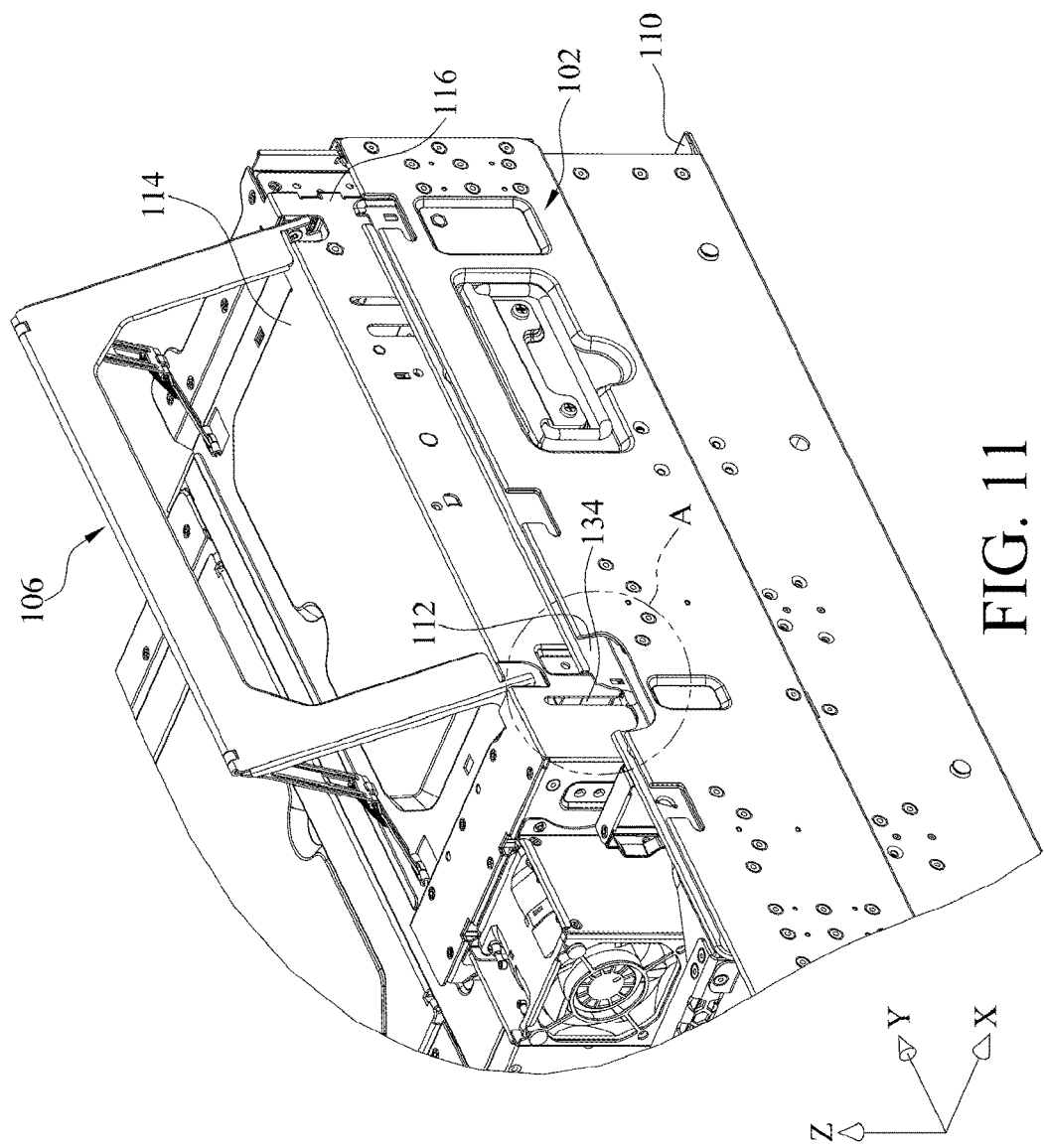
FIG. 11 to FIG. 14 are schematic views showing the process of assembling the support frame and the carrier by the handle.
Figure 15:
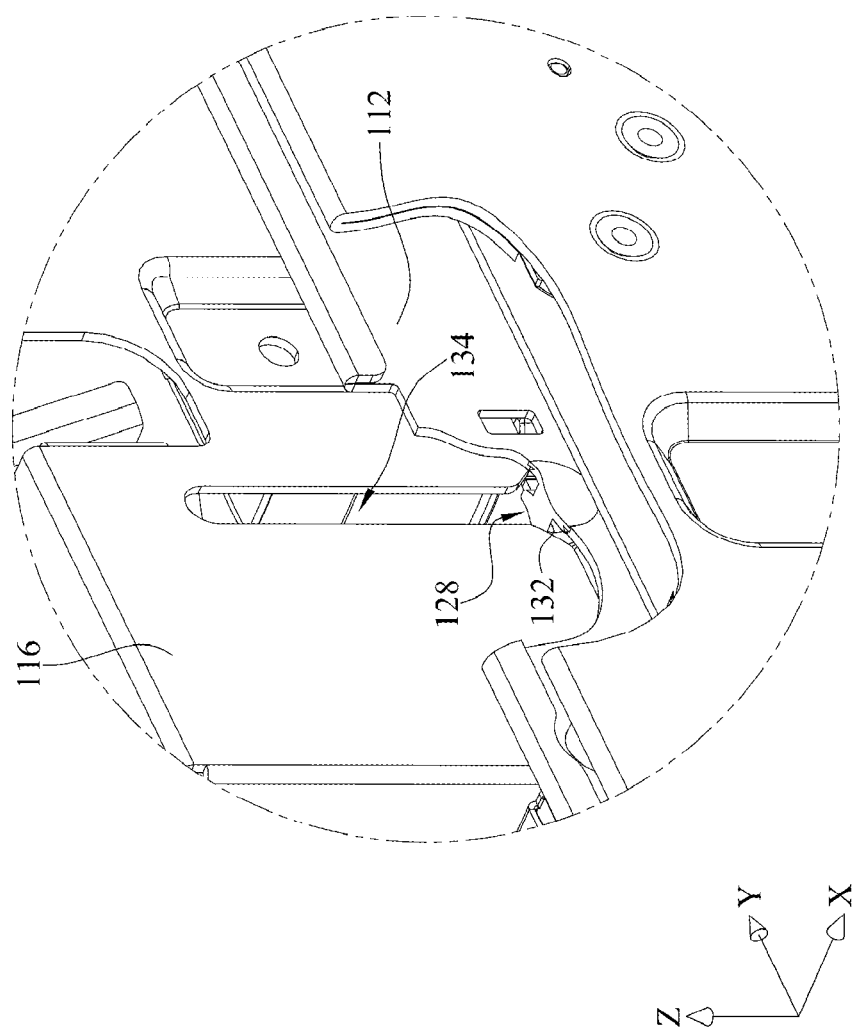
FIG. 15 to FIG. 18 are respectively partially enlarged views of FIG. 11 to FIG. 14.

FIG. 11 to FIG. 14 are schematic views showing the process of assembling the support frame and the carrier by the handle, and FIG. 15 to FIG. 18 are respectively partially enlarged views of FIG. 11 to FIG. 14. As shown in FIG. 11 and FIG. 15, by carrying the handle 106, a user is able to move the support frame 104 so as to insert the head part 130 (refer to FIG. 3 and FIG. 4) of the guiding piece 128 into the guiding portion 134 via a down end part 1341 (refer to FIG. 2) of the guiding portion 134. In the Y-axis, a width of the down end part 1341 of the guiding portion 134 is substantially the same as or similar to a width of the head part 130 of the guiding piece 128 so as to prevent the guiding piece 128 from departing from the guiding portion 134 as the guiding piece 128 slides along the guiding portion 134.

Figure 16:
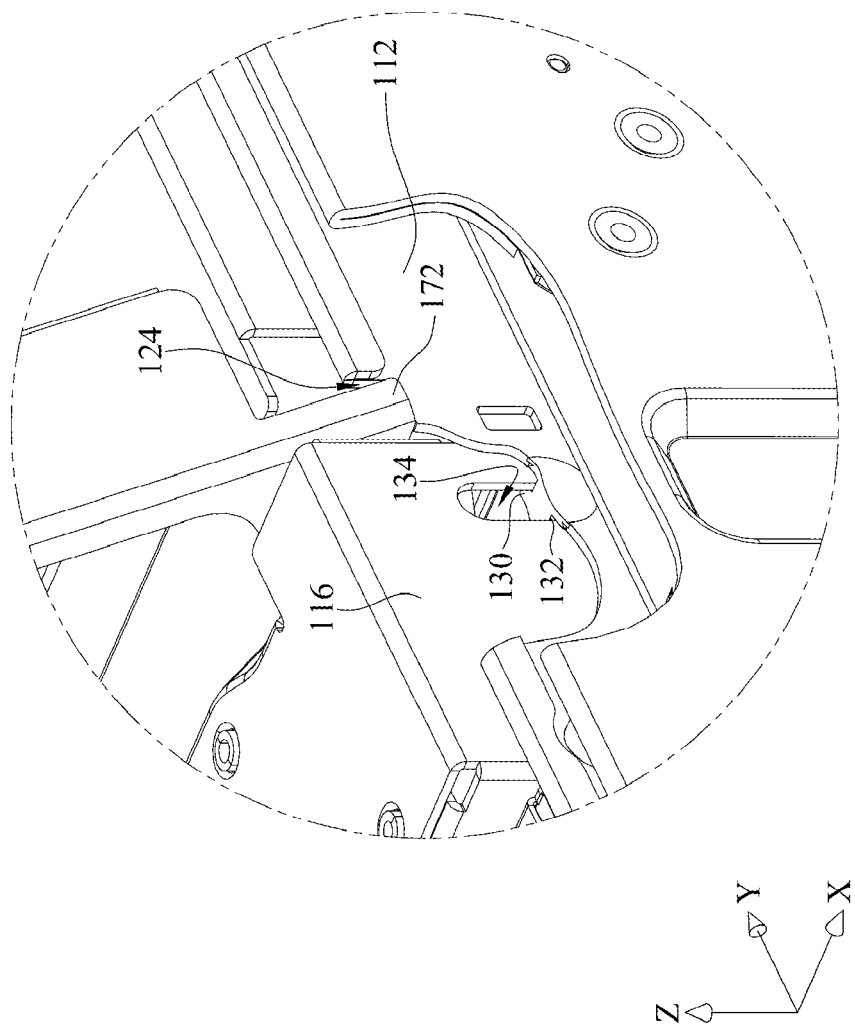

Then, as shown in FIG. 12 and FIG. 16, the user releases the handle 106 and let the support frame 104 to naturally move downward along the Z-axis toward the carrier 102 via the sliding connection of the guiding piece 128 and the guiding portion 134. During the movement of the support frame 104, the edge forming the guiding portion 134 contacts the neck part 132 of the guiding piece 128 so as to limit the movement of the support frame 104 along the Y-axis. Additionally, during the movement of the support frame 104, the second side plate 116 is parallel to the first side plate 112, and the head part 130 of the guiding piece 128 parallelly contacts the second side plate 116 so as to limit the movement of the support frame 104 along the X-axis. Thus, while the support frame 104 is moving toward the carrier 102, the cover plate 114 moves toward the base plate 110 and is maintained in a position parallel to the XY-plane, and the second side plate 116 moves toward the base plate 110 and is maintained in a position parallel to the YZ-plane.

Referring to FIG. 5, FIG. 12 and FIG. 16, each mounting portion 1061 further includes a contact portion 172. When the support frame 104 moves toward the carrier 102 to the abutting position P1, the two contact portions 172 of the handle 106 respectively press against the two indentations 124 of the first side plate 112, and the third connector 306 and the fourth connector 308 of the expansion card 304 are not yet electrically connected with the first connector 202 and the second connector 204 (not shown) of the main circuit board 200.

Figure 13:
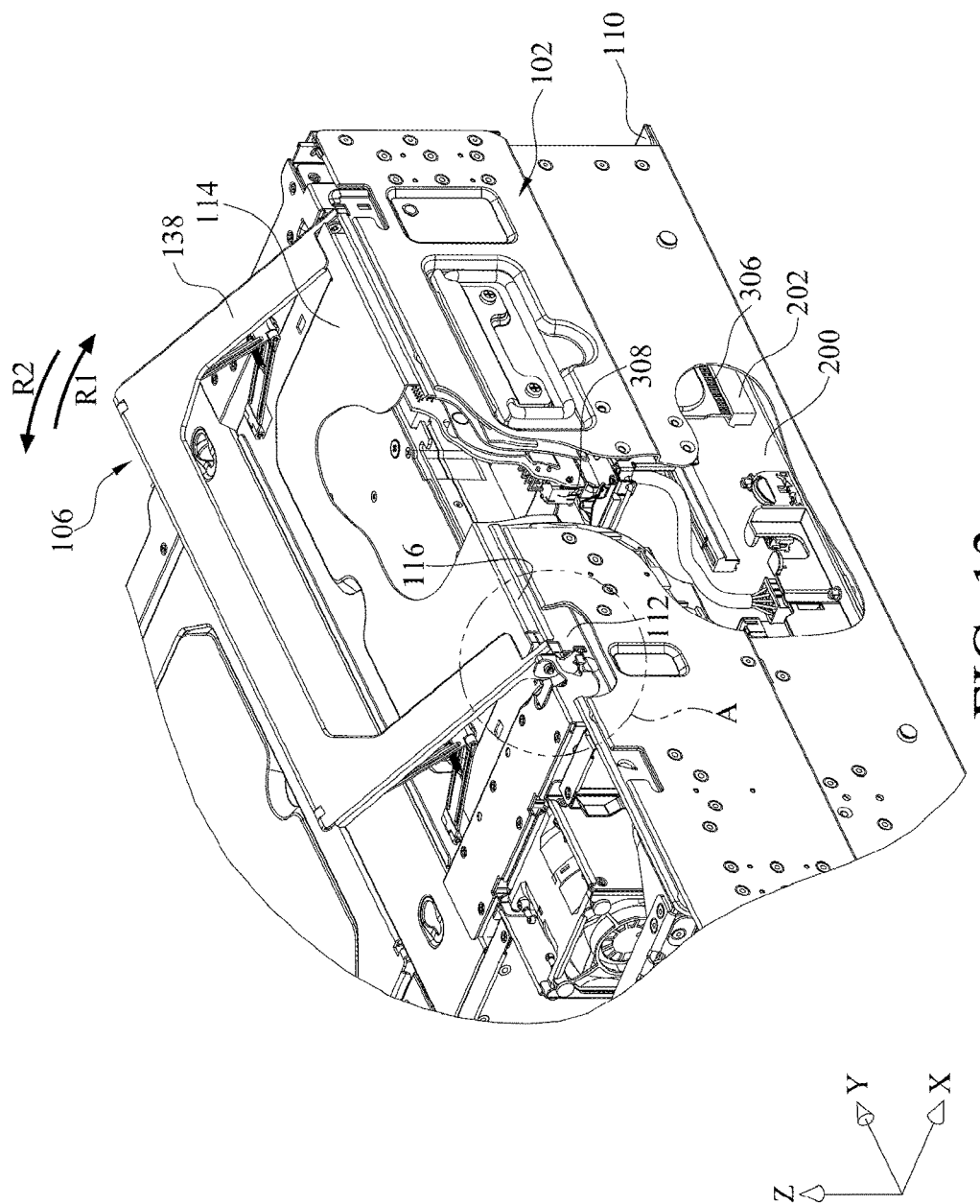
Figure 17:
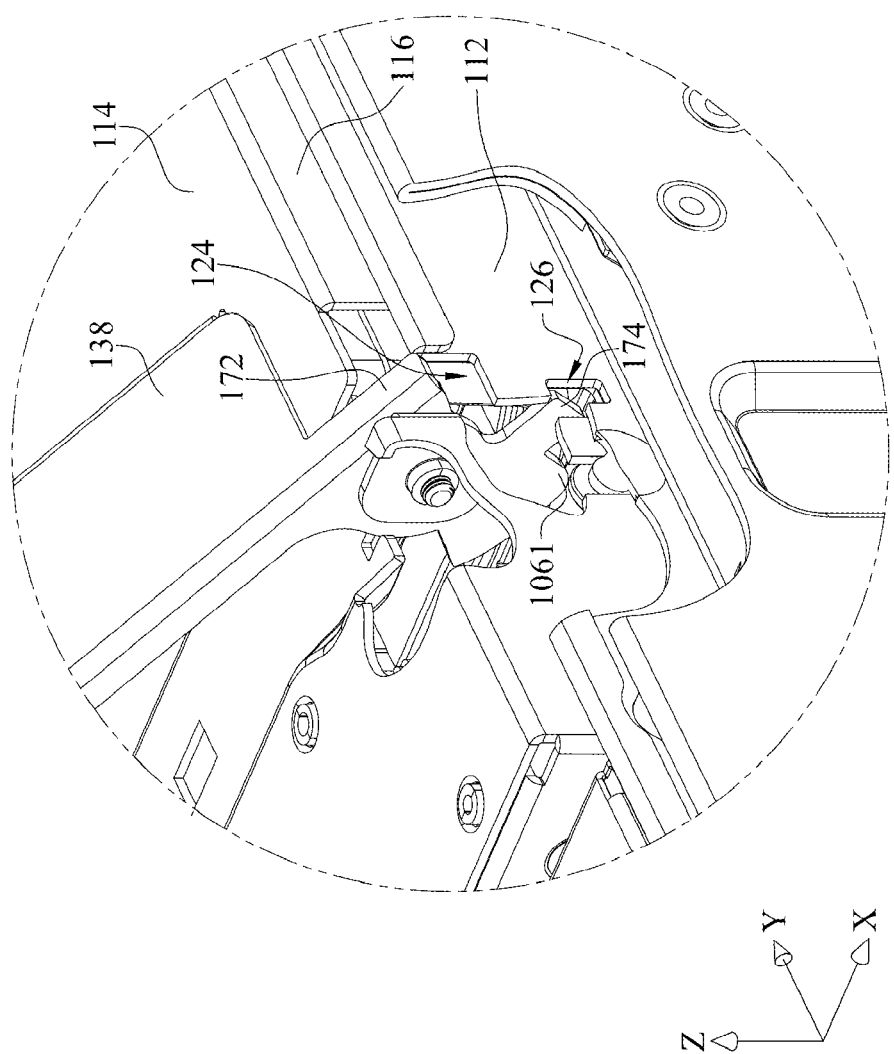

Referring to FIG. 5, FIG. 13 and FIG. 17, each mounting portion 1061 further includes an engage portion 174. When the handle 106 is pivoted along the second direction R2, the two contact portions 172 of the handle 106 are respectively detached from the two indentations 124, allowing the support frame 104 to move toward the carrier 102 along the Z-axis. When the handle 106 keeps pivoting along the second direction R2 until the engage portions 174 of the handle 106 respectively contact but yet not engage with the engage holes 126 of the first side plate 112, the third connector 306 and the fourth connector 308 of the expansion card 304 are not yet electrically connected with the first connector 202 and the second connector 204 (not shown) of the main circuit board 200 respectively.

Figure 18:
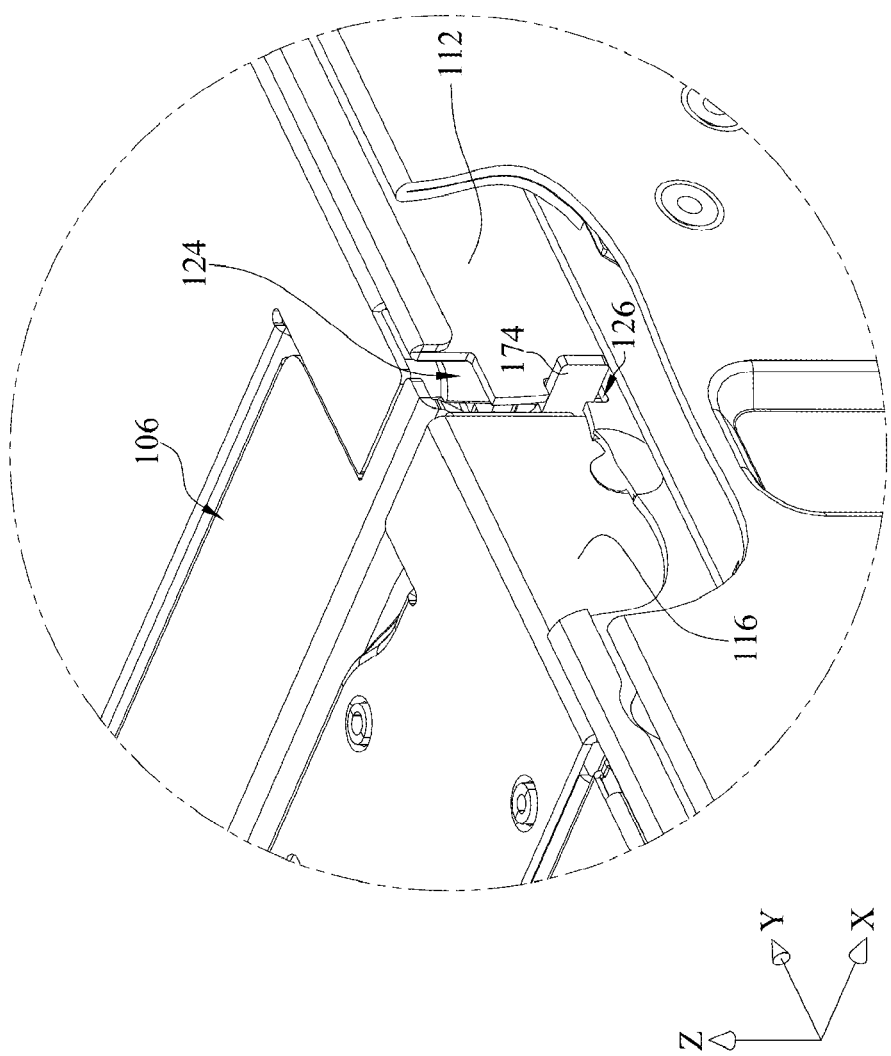

As shown in FIG. 14 and FIG. 18, when the handle 106 keeps pivoting along the second direction R2, the handle 106 will push the support frame 104 downward along the Z-axis so as to force the support frame 104 to move downward to the locked position P2 which is relatively close to the carrier 102. At this moment, the engage portions 174 of the handle 106 are respectively engaged with the engage holes 126 of the first side plate 112, and the third connector 306 and the fourth connector 308 of the expansion card 304 are respectively engaged and electrically connected with the first connector 202 and the second connector 204 of the main circuit board 200.

Figure 19:
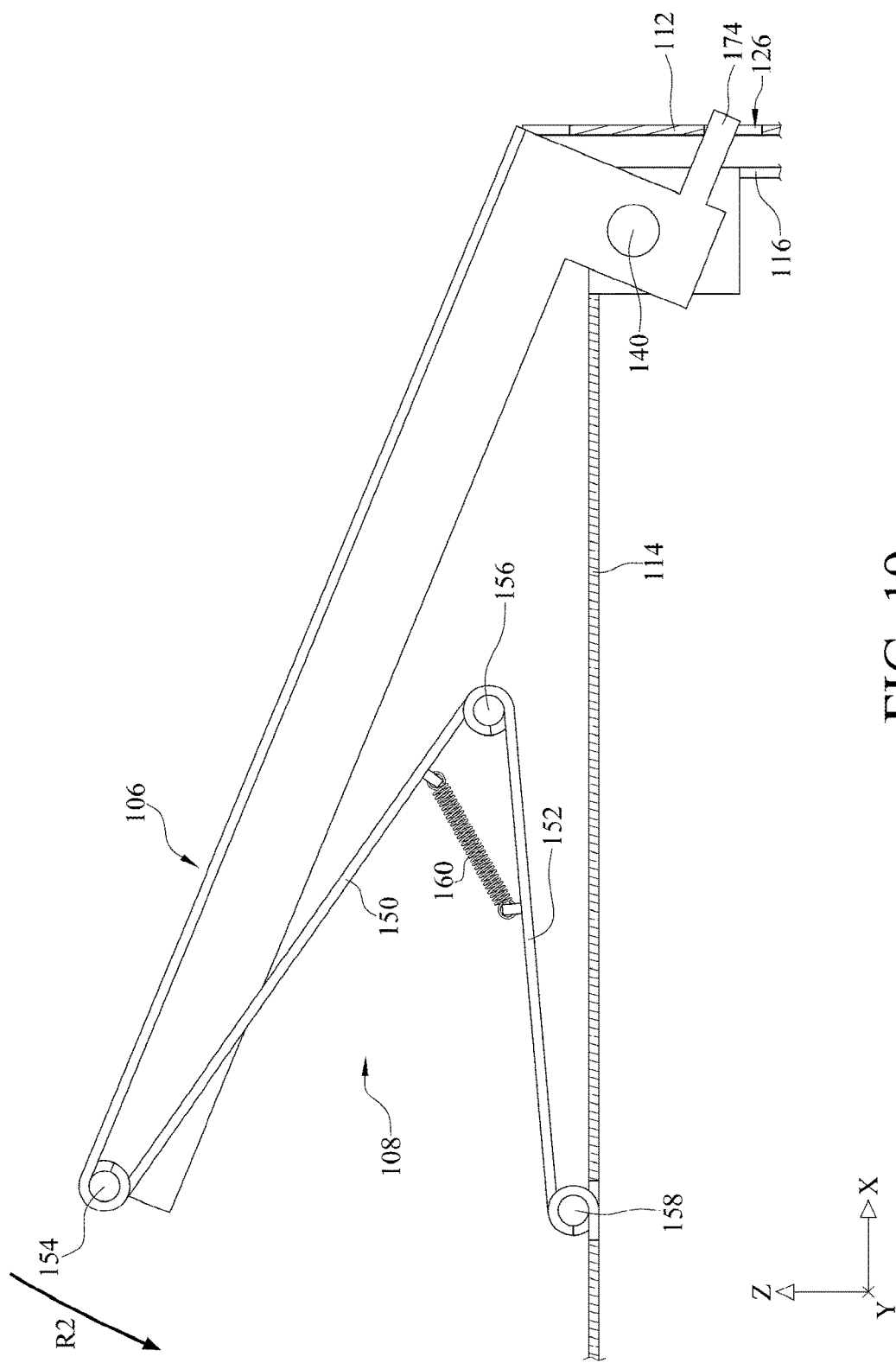
FIG. 19 and FIG. 20 are schematic views showing the process of folding the handle and the linkage assembly.
Figure 20:
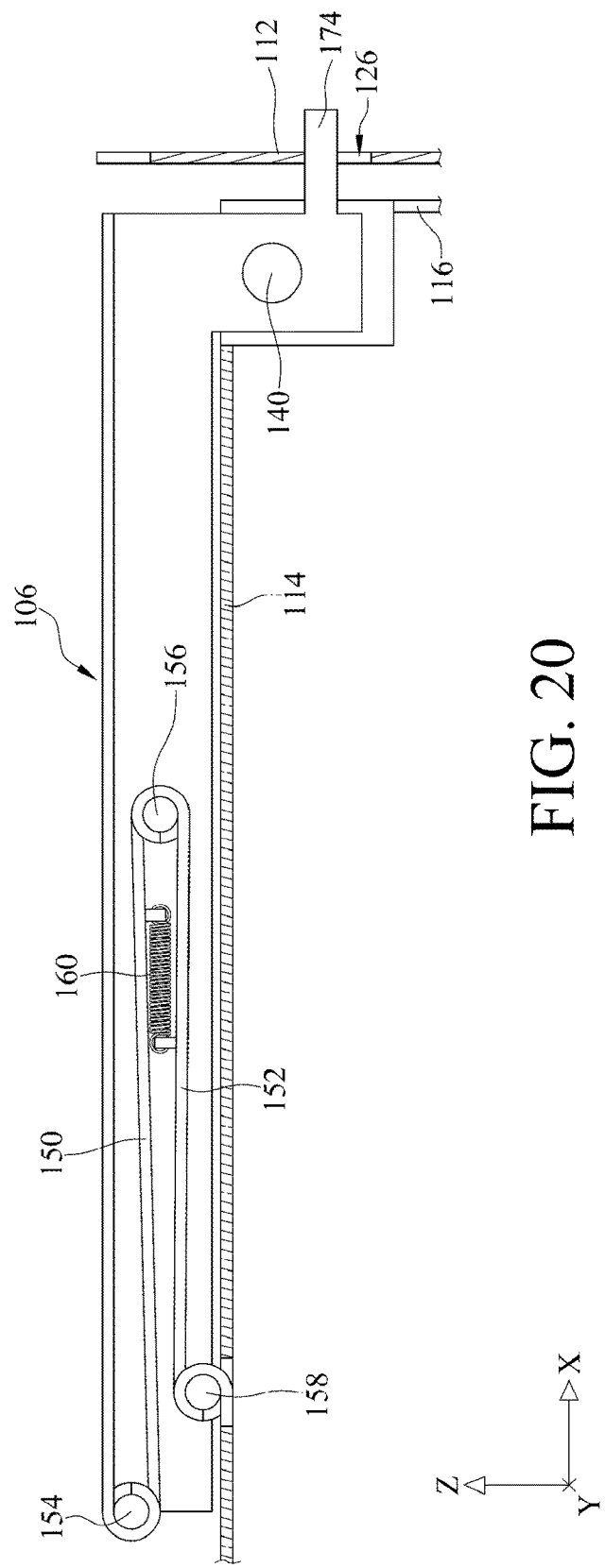

Please refer to FIG. 8, FIG. 10, FIG. 19 and FIG. 20. FIG. 19 and FIG. 20 are schematic views showing the process of folding the handle and the linkage assembly. The cover plate 114 includes a handle slot 176. When the handle 106 is released, the springs 160 force the linkage assembly 108 to be folded, and the movement of the linkage assembly 108 drives the handle 106 to pivot toward the handle slot 176. When the handle 106 and the linkage assembly 108 are pivoted and folded into the handle slot 176, the first linkage components 150 are respectively stacked on the second linkage components 152, the handle 106 is stacked on the linkage assembly 108, and the springs 160 are respectively accommodated in the first spring accommodating slot 164 and the second spring accommodating slot 166.

Figure 21:
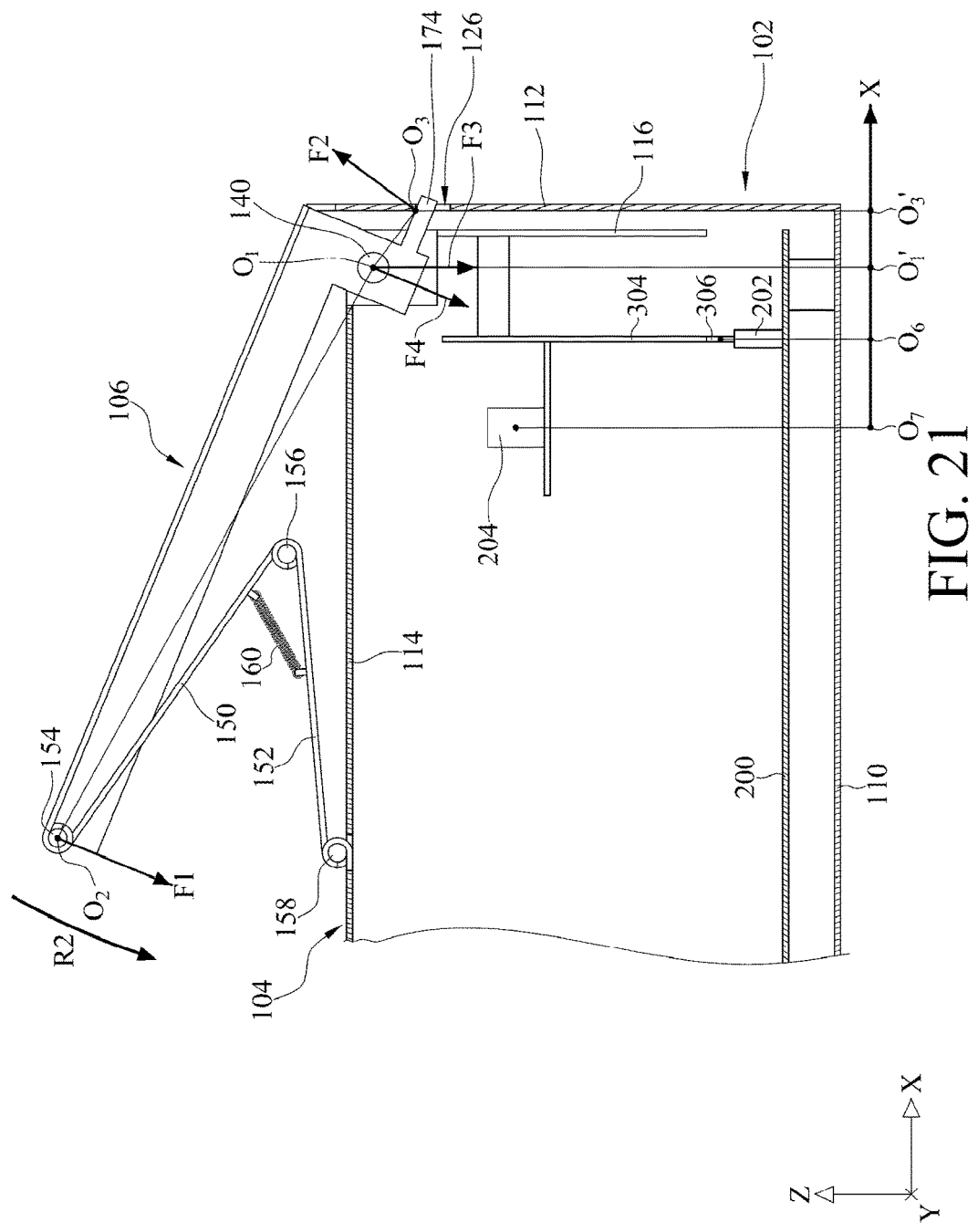
FIG. 21 is a schematic view showing how the detachable assembly device works.

FIG. 21 is a schematic view showing how the detachable assembly device works. As shown in FIG. 21, the first pivot 140 (defined as position $O_1$) is served as a fulcrum, the handle 106 is a served as a lever pivoted at the first pivot 140, and the linkage assembly 108 is pivotally connected to the handle 106 via the second pivot 154 (defined as position $O_2$). To simplify the mechanical analysis, the springs 160 are not taken into consideration. The arrows in the figure are merely used to show the direction of force instead of the magnitude of force. As shown in the figure, the user applies a force F1 on the position $O_2$ to fold down the handle 106 toward the cover plate 114 until the engage portion 174 of the handle 106 engages with the engage hole 126 (defined as position $O_3$) of the first side plate 112. At this moment, since the minimum distance $O_1O_2$ between the first pivot 140 and the second pivot 154 (namely, the distance between a pivoting axis of the first pivot 140 and a pivoting axis of the second pivot 154, which is the lever arm of the force F1 relative to the pivoting axis of the first pivot 140 when the force F1 is exerted on the handle 106) is much greater than the minimum distance $O_1O_3$ between the engage portion 174 of the handle 106 and the first pivot 140 (namely, the distance between the pivoting axis of the first pivot 140 and a pivoting axis (not shown) of the engage portion 174, which is the lever arm relative to the pivoting axis of the first pivot 140, of the reaction force from the engage hole 126 on the engage portion 174 when the force F1 is exerted on the handle 106), the force F1 can be small to create a force F2 against the first side plate 112. Since the carrier 102 is immovable, the reaction force F4 of the reaction force of the force F2 has a component force F3 that can be used to push the support frame 104 toward the carrier 102 to overcome the physical resistance created by the first connector 202 and the second connector 204 due to the insertion of the expansion card 304, making it easier to engage and electrically connect the third connector 306 and the fourth connector 308 of the expansion card 304 with the first connector 202 and the second connector 204 of the main circuit board 200.

When the springs 160 are considered, with the proper designation of the distance $O_1O_2$ and the pulling force of the springs 160, without applying additional force to the handle 106, the springs 160 are enough to fold down the handle 106 toward the cover plate 114 until the engage portions 174 are respectively engaged with the engage holes 126. When the engage portions 174 are respectively engaged with the engage holes 126, the third connector 306 and the fourth connector 308 of the expansion card 304 are respectively engaged and electrically connected with the first connector 202 and the second connector 204 of the main circuit board 200.

Furthermore, because the minimum distance $O_6O_3'$ between the first connector 202 of the main circuit board 200 and the engage portion 174 of the handle 106 (namely, a horizontal distance in X direction between the first connector 202 and the engage portion 174, which is the lever arm of the reaction force in the vertical Z direction from the first connector 202 when the force F1 is exerted on the handle 106) and the minimum distance $O_7O_3'$ between the second connector 204 of the main circuit board 200 and the engage portion 174 of the handle 106 (namely, a horizontal distance in X direction between the second connector 204 and the engage portion 174, which is the lever arm of the reaction force in the vertical Z direction from the second connector 204 when the force F1 is exerted on the handle 106) are both much smaller than the minimum distance $O_2O_2$ between the second pivot 154 and the engage portion 174, the force F1 has no need to be large to generate the force F4 at the first pivot 140 (position $O_1'$), and the torque produced by the force F4 balances the total torque produced by the physical resistances occurred at the first connector 202 and the second connector 204, preventing the support frame 104 from pivoting about the position $O_3$.

Figure 22:
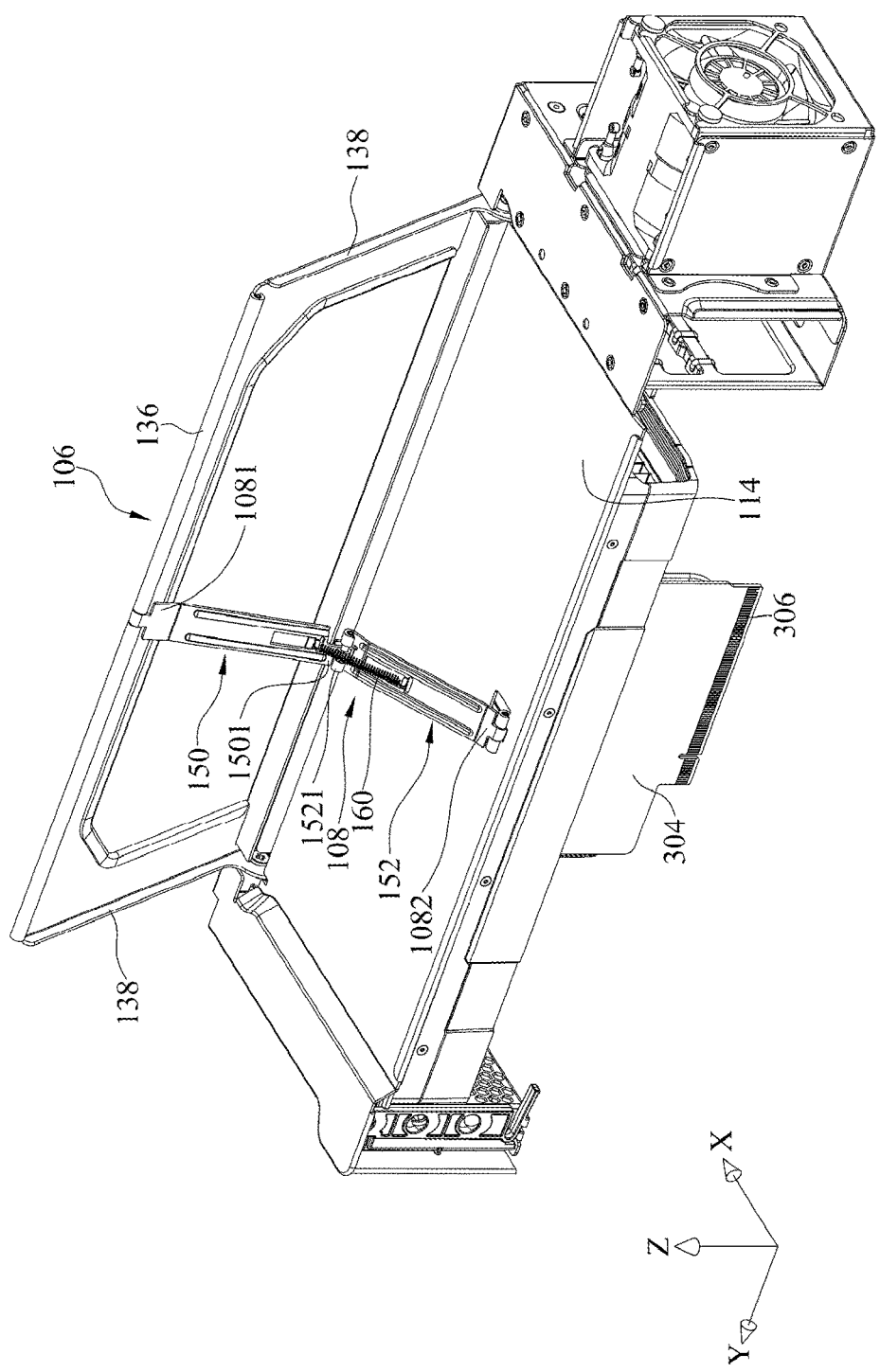
FIG. 22 is a perspective view of a detachable assembly device according to a second embodiment of the present disclosure.

FIG. 22 is a perspective view of a detachable assembly device according to a second embodiment of the present disclosure. The difference between the second embodiment and the first embodiment is that, in the second embodiment, the linkage assembly 108 only includes one first linkage component 150 and one second linkage component 152. In detail, in FIG. 22, the first connecting part 1081 of the first linkage component 150 is pivotally connected with the central portion of the middle part 136 of the handle 106, the third connecting part 1501 of the first linkage component 150 is pivotally connected to fourth connecting parts 1521 of the second linkage component 152, and the second connecting part 1082 of the second linkage component 152 is pivotally connected to the cover plate 114.

In other embodiments, the springs 160 can be located on different places on the linkage assembly 108. For example, two opposite ends of each spring 160 may respectively be fixed to the handle 106 and the first linkage component 150 of the linkage assembly 108; alternatively, two opposite ends of each spring 160 may respectively be fixed to the second linkage component 152 of the linkage assembly 108 and the cover plate 114.

As the detachable assembly device discussed above, the minimum distance between the engage portion of the handle and the first pivot is much smaller than the minimum distance between the first pivot and the second pivot, which helps the user to easily move the support frame toward the carrier to electrically connect the graphics processing module with the main circuit board by operating the handle.

In addition, the guiding portion of the second side plate extends toward the base plate, and thus, through the sliding engagement between the guiding portion and the guiding piece, the cover plate can be maintained in a position parallel to the base plate and second side plate can be maintained in a position parallel to the first side plate, during the movement of the support frame. Accordingly, the support frame is prevented from flipping while moving, and therefore the graphics processing module can be precisely engaged and electrically connected with the main circuit board.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A detachable assembly device, configured to electrically connect an electronic device with a main circuit board, the detachable assembly device comprising:
   a carrier, the carrier configured to fix the main circuit board, and the carrier comprising a base plate and a first side plate that are connected to each other;
   a support frame, the support frame being configured to fix the electronic device, the support frame being movably disposed on a side of the carrier and comprising a cover plate and a second side plate that are connected to each other, the cover plate covering the base plate, the first side plate and the second side plate being located between the base plate and the cover plate, and the second side plate being movably connected to the first side plate;

a handle, a portion of the handle being pivotally connected to a portion of the cover plate; and a linkage assembly, two portions of the linkage assembly respectively being pivotally connected to another portion of the handle and to another portion of the cover plate;

wherein when the support frame is located in a locked position, the handle and the first side plate are engaged with each other, and the electronic device is electrically connected with the main circuit board.

2. The detachable assembly device according to the claim 1, wherein the handle is pivotally connected to the cover plate at a first pivot axis, the linkage assembly is pivotally connected to the cover plate at a second pivot axis, and the first pivot axis and the second pivot axis are not coaxial.

3. The detachable assembly device according to the claim 1, wherein the electronic device comprises a first connector, and the main circuit board comprises a second connector, and when the support frame is located at an abutting position that is relatively away from the carrier, the first connector is not electrically connected with the second connector; when the support frame is moved from the abutting position to the locked position, the first connector is electrically connected with the second connector.

4. The detachable assembly device according to the claim 1, wherein the handle is pivotally connected with the second side plate and the linkage assembly respectively by a first pivot and a second pivot; when an engage portion of the handle presses against the first side plate, a distance between a pivoting axis of the engage portion and a pivoting axis of the first pivot is smaller than a distance between the pivoting axis of the first pivot and a pivoting axis of the second pivot.

5. The detachable assembly device according to the claim 4, wherein the main circuit board comprises a connector, and a distance between the connector and the engage portion, which is in a horizontal direction vertical to the pivoting axis of the engage portion, is smaller than a distance between the pivoting axis of the second pivot and the pivoting axis of the engage portion.

6. The detachable assembly device according to the claim 1, wherein the first side plate comprises a guiding piece, the second side plate comprises a guiding portion, the guiding piece and the guiding portion respectively extends toward the second side plate and the base plate, and the guiding piece is movably connected to the guiding portion.

7. The detachable assembly device according to the claim 1, wherein when the support frame is located in an abutting position relatively away from the carrier, the handle presses against the first side plate, and the electronic device is not electrically connected with the main circuit board.

8. The detachable assembly device according to the claim 1, wherein when the support frame is moved between an abutting position and the locked position, the cover plate is parallel to the base plate, and the first side plate is parallel to the second side plate.

9. The detachable assembly device according to the claim 1, wherein the first side plate is vertically connected to a side of the base plate, and the second side plate is vertically connected to a side of the cover plate.

10. The detachable assembly device according to the claim 1, wherein the handle comprises a contact portion and an engage portion, and the first side plate comprises an indentation and an engage hole; when the support frame is located in an abutting position relatively away from the carrier, the contact portion presses against the indentation; when the support frame is located in the locked position, the contact portion is separated from the indentation, and the engage portion is engaged with the engage hole.

11. The detachable assembly device according to the claim 1, wherein the handle comprises a middle part and two side parts, the opposite two ends of the middle part are respectively connected to the two side parts, and the linkage assembly is pivotally connected to the two side parts.

12. The detachable assembly device according to the claim 1, wherein the cover plate comprises a handle slot; when the handle is engaged with the first side plate, the handle and the linkage assembly are accommodated in the handle slot, and the handle covers the linkage assembly.

13. The detachable assembly device according to the claim 1, wherein the linkage assembly comprises a first linkage component and a second linkage component, two portions of the first linkage component are respectively pivotally connected to the handle and to a portion of the second linkage component, and another portion of the second linkage component is pivotally connected to the cover plate.

14. The detachable assembly device according to the claim 13, wherein the cover plate comprises a handle slot; when the handle is engaged with the first side plate, the handle, the first linkage component and the second linkage component are accommodated in the handle slot, the first linkage component covers the second linkage component, and the handle covers the first linkage component and the second linkage component.

15. The detachable assembly device according to the claim 13, wherein the second linkage component further comprises a protrusion; when the handle is pivoted by a predetermined angle along a direction away from the support frame, the protrusion presses against the first linkage component so as to prevent the handle from further pivoting along the direction.

16. The detachable assembly device according to the claim 13, wherein the linkage assembly further comprises a spring, and two opposite ends of the spring are respectively fixed to the first linkage component and the second linkage component.

17. The detachable assembly device according to the claim 16, wherein the first linkage component comprises a first spring slot, and the second linkage component comprises a second spring slot; when the handle and the first side plate are engaged with each other, the spring is accommodated in the first spring slot and the second spring slot.

* * * * *